United States Patent
Abe

[11] Patent Number: 5,180,469
[45] Date of Patent: Jan. 19, 1993

[54] METHOD FOR SLICING A SEMICONDUCTOR SILICON SINGLE CRYSTAL

[75] Inventor: Yasuhiko Abe, Tokyo, Japan

[73] Assignee: Kyoto Handotai Co., Ltd., Kyoto, Japan

[21] Appl. No.: 756,574

[22] Filed: Sep. 9, 1991

[30] Foreign Application Priority Data

Sep. 19, 1990 [JP] Japan .................................. 2-247377

[51] Int. Cl.$^5$ ............................................. H01L 21/00
[52] U.S. Cl. .................................... 156/653; 156/645; 156/638; 156/662; 156/625; 204/129.1
[58] Field of Search ............... 156/644, 647, 645, 638, 156/662, 625, 653; 204/129.1, 129.75, 129.4

[56] References Cited

U.S. PATENT DOCUMENTS

| | | | |
|---|---|---|---|
| 3,615,956 | 10/1971 | Irving | 156/645 |
| 3,841,931 | 7/1973 | McArthur et al. | 252/79.9 |
| 4,052,274 | 10/1977 | Chikamori | 204/129.1 |
| 4,224,101 | 9/1980 | Tijburg et al. | 156/662 |
| 4,448,655 | 5/1984 | Inoue | 204/129.1 |
| 4,908,198 | 3/1990 | Weinberg | 204/294 |
| 4,919,774 | 4/1990 | Minato et al. | 204/129.1 |
| 4,971,654 | 11/1990 | Schnegg et al. | 156/638 |
| 5,073,232 | 12/1991 | Ohmi et al. | 252/79.3 |

FOREIGN PATENT DOCUMENTS 63-009123 1/1988 Japan .

Primary Examiner—Brian E. Hearn
Assistant Examiner—George Goudreau
Attorney, Agent, or Firm—Wenderoth, Lind & Ponack

[57] ABSTRACT

A single crystal of semiconductor silicon can be sliced into wafers not by the conventional mechanical means but by a novel chemical means so that advantages are obtained in the reduced material loss by cutting and in the absence of any mechanically stressed layer in the surface of the wafer as sliced. The method comprises conducting electrolysis of an aqueous solution containing sulfuric and hydrofluoric acids with a fine platinum wire as the anode to evolve oxygen containing ozone on the anode surface while a single crystal of silicion is held in proximity to the wire anode so that the nascent oxygen formed from the ozone oxidizes silicon into silicon dioxide which as formed is dissolved away in the acidic medium to leave a groove in the single crystal. When the wire anode or the single crystal is continuously moved to keep a small distance between the wire anode and the groove bottom, the whole single crystal body is cut through to form a wafer.

8 Claims, 3 Drawing Sheets

METHOD FOR SLICING A SEMICONDUCTOR SILICON SINGLE CRYSTAL

BACKGROUND OF THE INVENTION

The present invention relates to a method for slicing a single crystal of semiconductor silicon into wafers. More particularly, the invention relates to a method for slicing a single crystal of semiconductor silicon into wafers not by a mechanical means but by a chemical means.

As is well known, single crystals of semiconductor silicon are used almost without exception in the form of a thin wafer having a thickness of, for example, 0.6 mm or smaller. Silicon wafers are obtained conventionally by slicing a single crystal by a mechanical means. For example, a so-called internally bladed slicing machine equipped with a wheel, which is a thin plate of stainless steel in an annular form having a thickness of a few hundreds micrometers, of which fine diamond particles of 40 to 60 μm diameter as an abrasive are electrodeposited on and embedded in the internal periphery of the annular plate to form a cutting blade, and the single crystal of silicon are put under an adequate contacting force at the diamond blade of the annular plate rotating at a velocity of several thousands rpm under tension in the radial direction so that the diamond particles grind off the single crystal material by the thickness of the blade finally resulting in cutting through of the single crystal to give wafers by repeating this cutting procedure.

The above described mechanical method for slicing a silicon single crystal has several problems and economical disadvantages. For example, firstly, it is unavoidable that a material loss caused in the single crystal in every slicing movement corresponding to the thickness of the cutting blade so that the yield of the wafers obtained by slicing is limited by the thickness of the cutting blade which is usually several tenths of the wafer thickness. Secondly, such a mechanical means of cutting naturally has a serious influence on the surface of the wafer to give a large stress thereto as sliced so that the surface layer of the wafer having a thickness of 15 μm or larger is under a strong stress not to exhibit the properties inherent in the single crystal per se so that the wafer is unavoidably warped by 10 to 50 μm. Accordingly, subsequent finishing works are indispensable including lapping to improve the flatness of the wafer by means of rolling abrasive particles and chemical etching to remove the stressed surface layer. An additional amount of the material loss is again caused by these finishing works sometimes amounting 150 μm or even larger in thickness as a total per wafer. Thus, it is not rare that the overall material loss calculated as thicknesses of the wafer is 400 μm or larger per single wafer having thickness of 0.45 mm or smaller.

With an object to decrease the material loss in the preparation of silicon wafers by slicing single crystals, a so-called "wire-sawing" method has been recently proposed in which a fine metal wire serves as a cutting blade in place of conventional diamond-bladed wheels. This method, however, is also a mechanical cutting method so that, even though the material loss by slicing could be reduced to some extent, no remedy can be obtained relative to the stressed surface layer and deformation of the silicon wafers formed by the mechanical cutting means.

SUMMARY OF THE INVENTION

The present invention accordingly has been completed as a result of the extensive investigations to provide a novel and improved method for slicing a single crystal of semiconductor silicon with a greatly decreased material loss by cutting and without causing any deformation or stress in the surface layer of the silicon wafer unavoidable in any mechanical cutting means.

Thus, the method of the invention for slicing a single crystal of semiconductor silicon into wafers comprises the step of:

(a) holding the single crystal of semiconductor silicon as immersed in an acidic aqueous solution containing sulfuric acid and hydrofluoric acid;

(b) holding a metal wire having a surface of platinum, e.g., a platinum wire or a platinum-plated metal wire, under a tension in the said acidic aqueous solution at a small distance from the surface of the single crystal;

(c) immersing a metal electrode in the said acidic aqueous solution;

(d) electrolyzing the acidic aqueous solution with the wire and the metal electrode as the anode the cathode, respectively, the current density on the surface of the anode being at least 50 $A/dm^2$, to produce an ozone-containing oxidizing gas which oxidizes the silicon into silicon dioxide;

(e) removing the silicon dioxide by dissolving in the acidic aqueous solution to form a groove in the single crystal; and (f) moving the wire of the single crystal in such a manner that a small distance is kept between the wire and the single crystal at the bottom of the groove until the single crystal is radially cut through.

DETAILED DESCRIPTION OF THE PREFERRED EMBODIMENTS

As is described above, the very scope of the inventive method consists in the oxidation of the silicon single crystal by means of an electrolytically produced ozone-containing oxidizing gas into silicon dioxide in an acidic electrolyte bath containing hydrofluoric acid so that the silicon dioxide as formed is dissolved away in the acidic bath to leave a groove in the single crystal.

Figure 1:
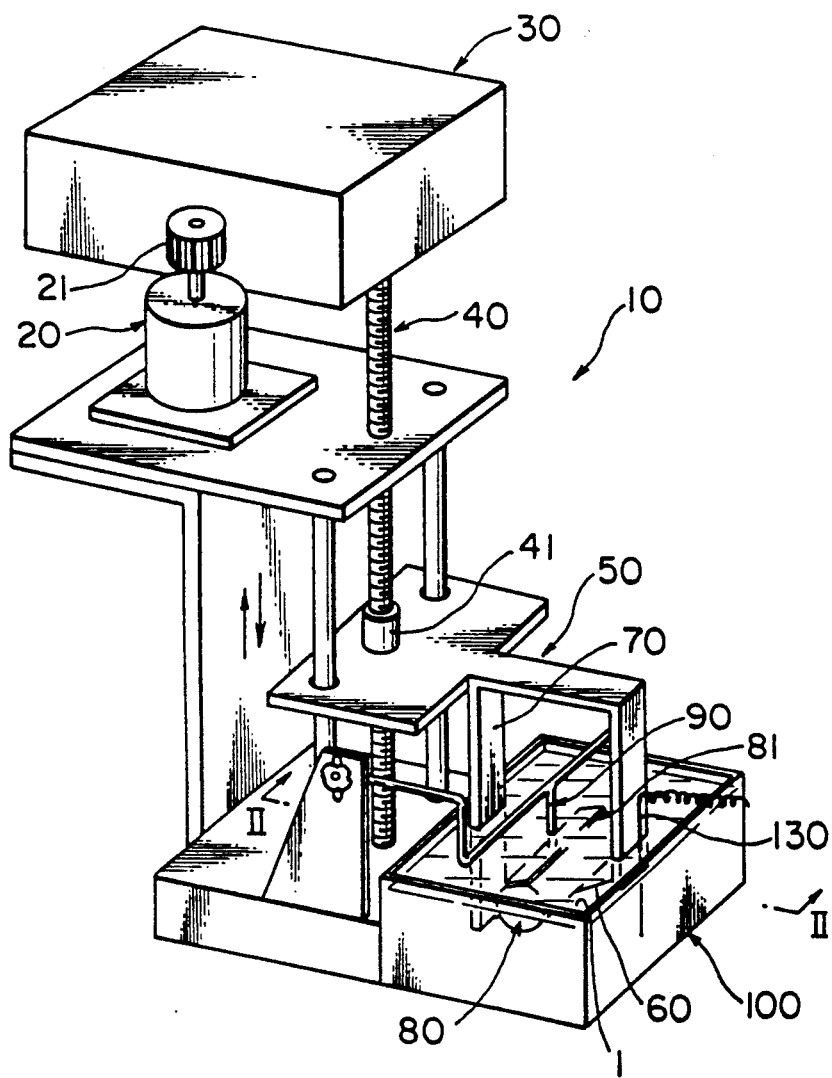
FIG. 1 is a perspective view of the apparatus used in practicing the method of the invention and FIG. 2 is a cross sectional view of the same apparatus as cut and viewed in the direction shown by the arrows II—II in FIG. 1.
Figure 2:
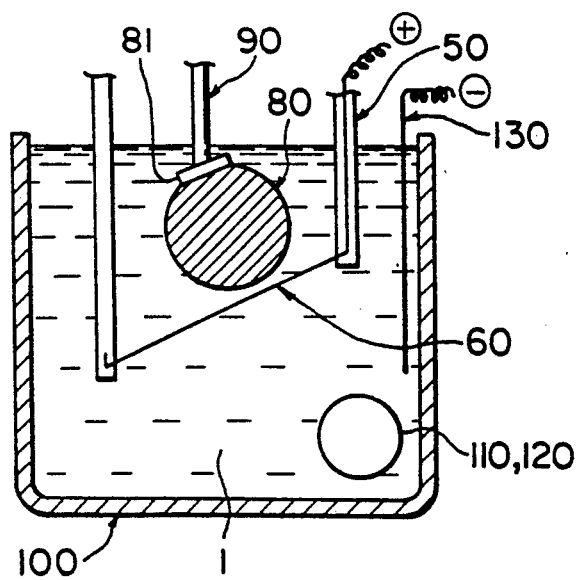

In the following, the method of the invention is described in more detail with reference to the accompanying drawing or, in particular to FIGS. 1 and 2 illustrating a perspective view and a cross sectional view, respectively, of the apparatus used in practicing the method of the present invention.

As is illustrated in the figures, the single crystal of semiconductor silicon 80 is held in an acidic electrolyte bath 1 contained in the acid-resistant vessel 100 of the apparatus 10 by means of a chucking device 90 at the orientation flat 81. It is convenient, though not limitative, that the single crystal 80 is held by keeping the axis in parallel to the surface of the electrolyte bath 1 as is shown in the figures.

In closed proximity to the surface of the single crystal 80, a wire 60, which servers as an anode in the electrolysis, is held as immersed in the electrolyte bath 1 under an adequate tension by the electrode holders 50,50 made from an acid-resistant material such as a fluorocarbon resin. Namely, the single crystal 80 is held in the space 70 surrounded by the electrode holders 50,50 and the wire 60. In order to ensure smooth electrolysis of the electrolyte bath 1, the wire 60 must have a surface of platinum so that the wire can be a platinum wire or a platinum-plated wire of a metal such as copper. Since platinum wires are susceptible to the phenomenon of creeping under tension and have a relatively high electric resistance, such a platinum-plated copper wire is advantageous in respect of the high resistance against tension and outstandingly low electric resistance as compared with platinum wires of the same diameter. The wire 60 should have a diameter as small as possible or, preferably, in the range from 0.05 to 0.5 mm though not particularly limitative. A wire having a too large diameter is undesirable due to the increase in the material loss by cutting while a wire having a two small diameter would be less resistant against tension. The direction of the wire 60 is usually perpendicular to the axis of the single crystal 80 in order to slice the single crystal 80 in an exactly radial plane.

The distance between the wire 60 as the anode in a straightly linear conformation under tension and the surface of the single crystal 80 should be kept as small as possible or, preferably, should not exceed 1.0 mm. When the distance is too large, the efficiency of the chemical slicing would be decreased with less sharpness of cutting.

The electrolyte bath 1 is an aqueous solution containing sulfuric acid and hydrofluoric acid. The concentrations of these acids are preferably in the range from 7 to 35% by weight for sulfuric acid and from 20 to 60% by weight for hydrofluoric acid. When the concentration of sulfuric acid is too low, the concentration of ozone in the oxidizing gas produced on the anode surface would be low to decrease the efficiency of the chemical cutting method while, when the concentration of sulfuric acid is too high, dissolution of the silicon dioxide by the hydrofluoric acid would be disturbed. When the concentration of hydrofluoric acid is too low, dissolution of silicon dioxide thereby cannot proceed smoothly. The velocity of the chemical cutting can be increased by the addition of a small amount of acetic acid, uric acid or iodine to the electrolyte solution.

It is of course that a metal electrode 130 to serve as the cathode is held in the electrolyte bath 1. It is desirable that the metal electrode 130 is fully resistant against the attack of the acidic electrolyte bath 1 containing sulfuric acid and hydrofluoric acid. In this regard, the metal electrode 130 is preferably also a platinum electrode or a platinum-plated copper electrode.

By arranging the apparatus 10 and the single crystal 80 in the above described fashion, electrolysis is performed by applying a direct-current voltage between the metal wire 60 as the anode and the metal electrode 130 as the cathode. The voltage applied to the electrodes should be in the range from 4 to 10 volts when the cathode 130 has surface of platinum. It is important that the current density on the anode surface is at least 50 A/dm$^2$ or, preferably, in the range from 50 to 100 A/dm. When the current density is too small, substantially no cutting takes place.

The temperature of the electrolyte bath 1 is not particularly limitative and the electrolysis can be performed at room temperature. It is preferable, however, that the electrolyte bath 1 is kept at an elevated temperature because the velocity of the chemical cutting process can be increased thereby. In this regard, the electrolyte bath 1 is preferably kept at a temperature in the range from 25° to 60° C. by means of the thermostatted heating means 110 with a stirrer 120 for agitating the bath 1. When the temperature of the electrolyte bath 1 is too high, the rate of evaporation of water from the bath 1 is so high that the concentration of the acids in the bath 1 may be subject to increase during proceeding of the electrolysis to cause difficulties in the control of the electrolytic conditions.

By conducting electrolysis in the above described manner, the aqueous acid solution 1 is electrolyzed to produce hydrogen gas on the surface of the cathode 130 and oxygen gas on the surface of the anode 60. It is known that the oxygen gas as produced on the anode surface contains a substantial amount of ozone which is subsequently decomposed into oxygen. It has been unexpectedly discovered that the nascent oxygen as produced by the decomposition of ozone is in such a highly activated state that the single crystal 80 of silicon is readily oxidized by the nascent oxygen to be converted into silicon dioxide which as formed is readily dissolved away by the acidic medium 1 containing hydrofluoric acid so as to form a very narrow groove on the surface of the single crystal 80.

In the apparatus arrangement illustrated in FIGS. 1 and 2, the single crystal 80 and/or the wire 60 as the anode are moved downwardly or upwardly, respectively, as a groove is formed in the single crystal 80 so as to keep a small distance between the wire 60 and the surface of the groove bottom in the single crystal 80. The velocity of this relative movement of the single crystal 80 and/or the anode 60 should desirably coincide with the rate of increase in the depth of the groove formed in the single crystal 80. In most cases, the velocity is a few millimeter per hour although a considerable increase of the velocity is within possibility by adequately selecting various parameters. In the apparatus 10 illustrated in FIG. 1, this relative movement can be achieved by the upward movement of the wire anode 60 by means of the gear-and-screw mechanism comprising an electric motor 20, such as a servo motor rotating at a low velocity of, for example, 1 rpm, with a gear 21, a gear box 20 for reducing the rotation of the motor, a ball screw 40 and a socket screw 41 penetrated by all the ball screw 40, to which the celectrode holder 50 for holding the wire anode 60 is rigidly fixed. It is important that the very slow upward movement of the wire anode 60 or downward movement of the single crystal 80 is performed very smoothly absolutely without vibration and without any backlash in the gear-and-screw mechanism for velocity reduction.

The velocity of chemical cutting according to the inventive method can be greatly increased when the single crystal 80 or the wire anode 60 is reciprocatively or vibrationally moved up and down at a suitable frequency and in a suitable amplitude so as to perpetually bring a fresh portion of the acidic solution 1 by the agitating movement of the single crystal 80 or wire 60 into contact with the silicon dioxide formed at the bottom of the groove formed in the single crystal 80. Such a reciprocative or vibrational movement can be readily obtained by using a pulse motor or ultrasonic motor.

Figure 4:
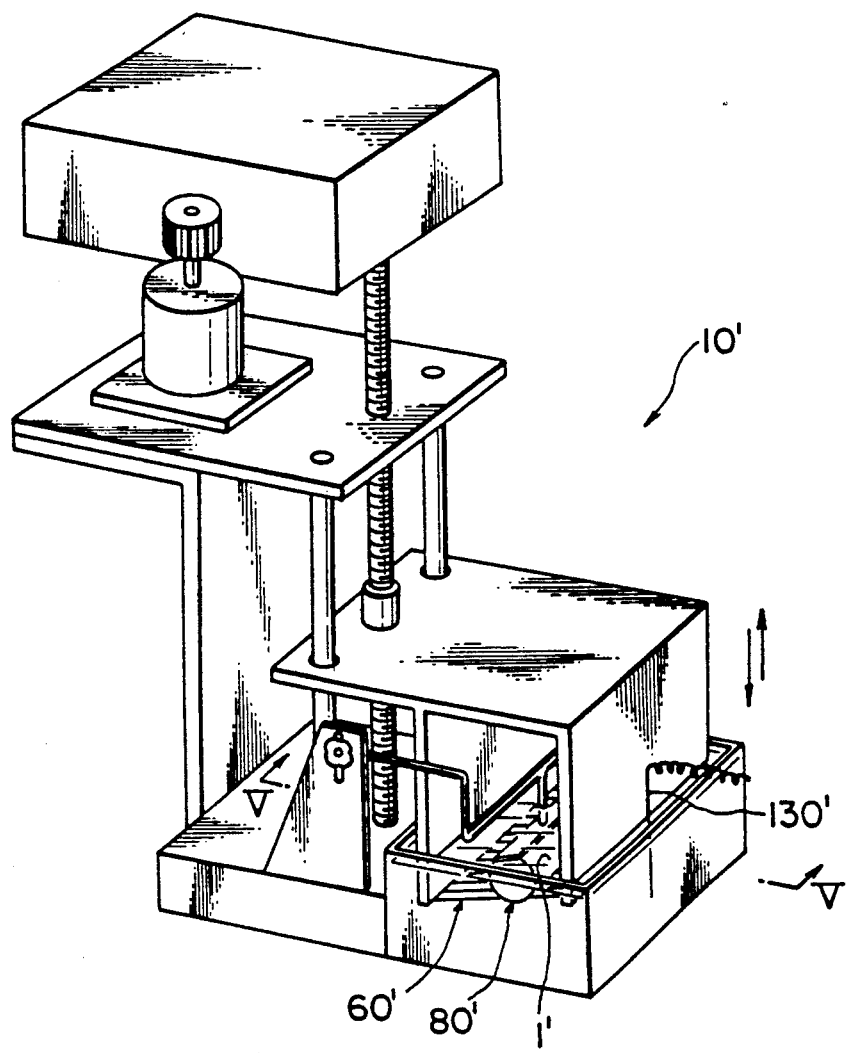
FIG. 4. is a perspective view of a variation of the apparatus having a multiple-wire anode
Figure 5:
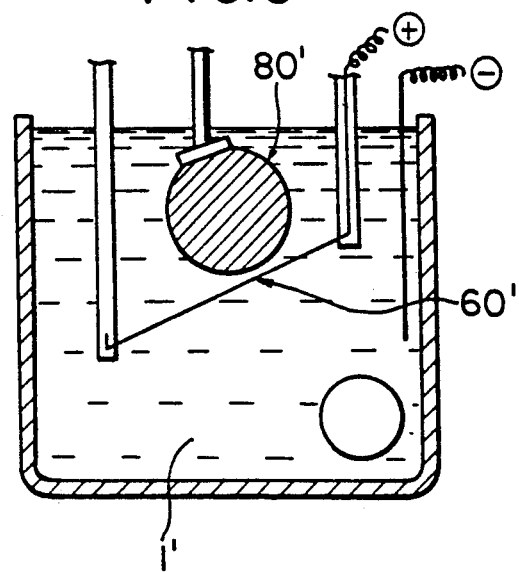
FIG. 5 is a cross sectional view of the same apparatus as cut and viewed in the direction shown by the arrows V—V in FIG.4.

Although the apparatus 10 illustrated in FIGS. 1 and 2 has only one wire 60 as the anode, it is a possible design of an industrially useable apparatus that, as is illustrated in FIGS. 4 and 5, a large number of wire anodes 60' are provided in parallel with each other in such a fashion like a reed in a weaving loom so as to obtain a number of sliced wafers by a single cut-through movement of the reed electrodes 60' through the single crystal 80. The disadvantageously low cutting velocity with a single wire anode 60 can be compensated for by using an apparatus 10' provided with such a multiple-wire anode 60' shown in FIGS. 4 and 5.

In the following, the method of the invention is described in more detail by way of examples.

EXAMPLE 1

The apparatus used in this experiment was as illustrated in FIGS. 1 and 2. The vessel 100 made of Teflon resin was filled with an acidic aqueous solation prepared by mixing equal volumes of a 14.7% aqueous solution of sulfuric acid and a 49.5% aqueous solution of hydrofluoric acid as the electrolyte bath 1 which was kept at a temperature of 36° C. by the heating means 110 with stirrer 120. A single crystal of semiconductor silicon 80 having a diameter of 50 mm and a length of 100 mm provided with an orientation flat 81 was adhesively bonded at the orientation flat 81 to the chucking means 90 by using an epoxy resin-based hot-melt adhesive and immersed in the electrolyte bath 1 in such a disposition that the axis of the single crystal 80 is in parallel to the surface of the bath 1.

A wire electrode 60 made from a platinum-plated copper wire of 0.2 mm diameter was held as tensioned by means of the Teflon-made electrode holder 50 in the electrolyte bath 1 just below the single crystal 80 almost in direct contract therewith. The direction of the wire anode 60 was exactly perpendicular to the axis of the single crystal 80. Separately, a platinum wire 130 having a diameter of 0.2 mm was immersed by hanging in the electrolyte bath 1 as the cathode along the wall of the vessel 100. The anode 60 and the cathode 130 were electrically connected to the positive and negative terminals, respectively, of a direct-current power supply.

When the electric current between the anode 60 and the cathode 130 was controlled such that the current density on the anode surface was 80 $A/dm^2$, hydrogen gas and oxygen gas were formed on the surface of the cathode 130 and anode 60, respectively. This electrolytic procedure was continued for 10 hours while the motor 20 was driven so that the electrode holder 50 holding the wire anode 60 was upwardly moved at a constant velocity of 0.2 mm per hour. The single crystal 80 was then taken out of the electrolyte bath 1 followed by rinse with water and drying and inspected to find that a groove of about 0.2 mm width and 2 mm depth was formed on the surface. This incisiveness of the groove thus formed was very complete without any slightest chamfering. Accordingly, the cutting velocity was 0.2 mm per hour.

EXAMPLE 2

The experimental procedure in this example was substantially the same as in Example 1 described above except that the velocity of the upward movement of the wire electrode 60 was 0.1 mm per hour and the temperature of the electrolyte bath 1 was controlled at 31° C. The groove formed on the single crystal 1 after 10 hours of running had a width of about 0.2 mm and a depth of 1.0 mm. The velocity of cutting was accordingly 0.1 mm per hour. The incisiveness of the groove thus formed was as complete as Example 1 or even better.

EXAMPLES 3 AND 4

The experimental procedure in each of these examples was substantially the same as in Example 1 described above except that the diameter of the wire anode 60 was 0.1 mm instead of 0.2 mm, the velocity of the upward movement of the wire electrode 60 was controlled at 0.4 mm and 0.7 mm, respectively, per hour and the temperature of the electrolyte bath 1 was controlled at 46° C. and 50° C., respectively. The electrolytic current was a half of that in Examples 1 and 2 so that the current density on the anode surface was kept unchanged. The groove formed on the single crystal 80 after 10 hours of running had a width of about 0.1 mm and a depth of 4.0 mm and 7.0 mm, respectively. The velocity of cutting was accordingly 0.4 mm and 0.7 mm, respectively, per hour. The incisiveness of each of the grooves thus formed was as complete as in Example 1.

Figure 3:
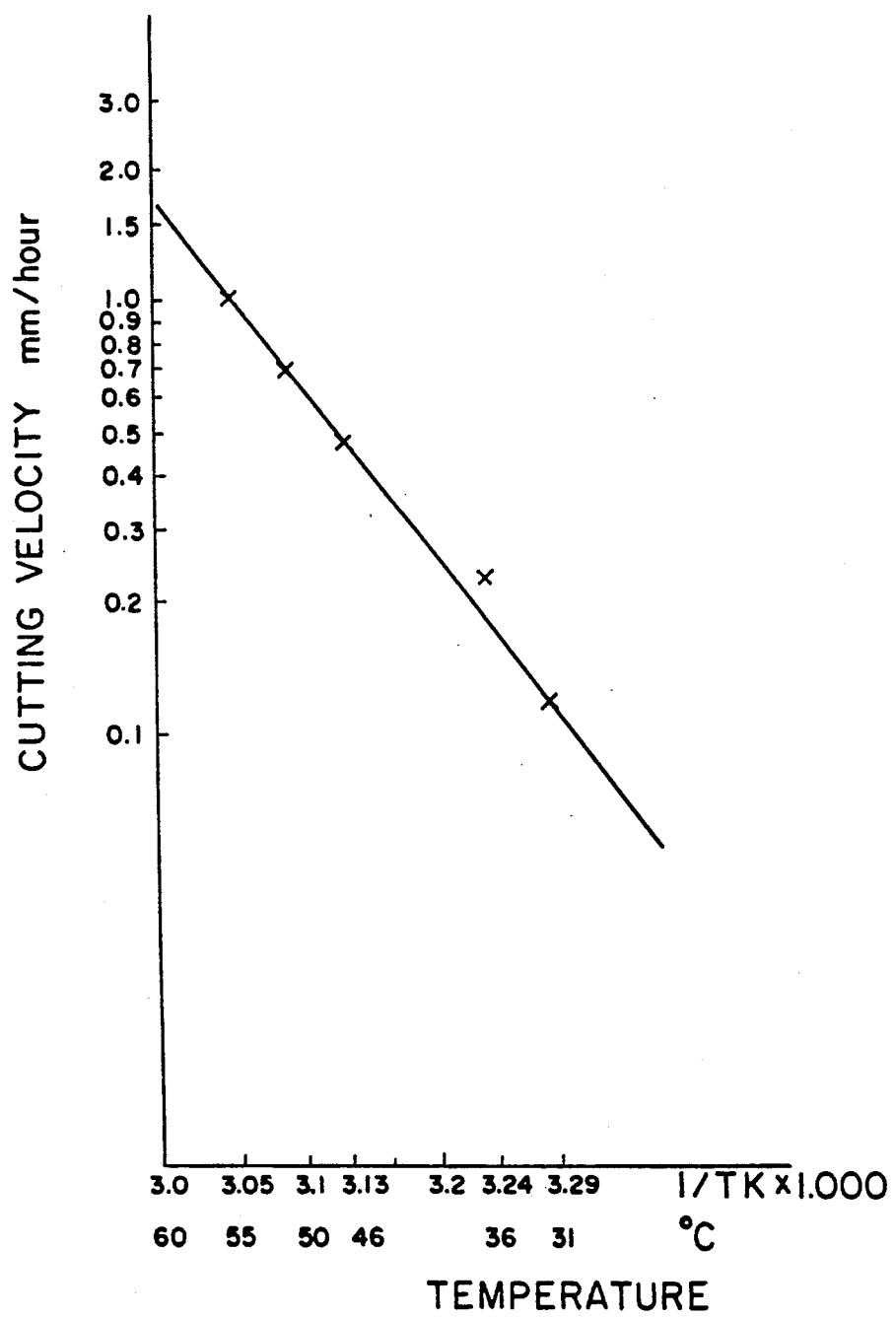
FIG. 3 is a graph showing the cutting speed as a function of the temperature of the electrolytic bath plotting the data obtained in examples.

The above obtained results of the cutting velocity as well as the values obtained in Examples 1 and 2 and the value obtained in Example 6 described below were plotted taking the reciprocal of the absolute temperature in K. as the abscissa and the cutting velocity as the ordinate to give the graph shown in FIG. 3 from which it is understood that a good linear relationship is held between the reciprocal of the absolute temperature in K. and the cutting velocity.

EXAMPLE 6

The apparatus illustrated in FIGS. 4 and 5 having a large number of wire electrodes 60' was used. The structure of the apparatus 10' was substantially the same as that of the apparatus 10 illustrated in FIGS. 1 and 2 except that, instead of the single wire anode 60, parallel 799 wire anodes 60', each being a platinum-plated copper wire having a diameter of 0.1 mm, were assembled in a frame at a pitch of 0.5 mm in the form something like a loom reed. The single crystal 80' of semiconductor silicon had a diameter of 100 mm and a length of 400 mm. The operating conditions were substantially the same as in the preceding examples including the current density on the surface of each of the wire anodes 60' but the electrolyte bath 1' was controlled at a temperature of 55° C. and the velocity of the upward movement of the anode reed 60' was 1 mm per hour.

After running for 100 hours in the above described manner, the single crystal was cut through by the 799 wire anodes 60' to give 789 wafers each having a thickness of about 0.4 mm. The variation in the thickness of the wafers was within 5 $\mu$m and the surface roughness did not exceed 0.2 $\mu$m. The wafers had substantially no stressed surface layer so that they can be directly finished by mirror-polishing by omitting the process of lapping. The material loss by cutting was 100 $\mu$m in thickness per wafer which was only one fourth of 400 $\mu$m unavoidable in the conventional mechanical cutting method.

What is claimed is:

1. A method for slicing a single crystal of semiconductor silicon into wafers which comprises the step of:

(a) holding the single crystal of semiconductor silicon as immersed in an acidic aqueous solution containing sulfuric acid and hydrofluoric acid;

(b) holding a metal wire having a surface of platinum under a tension in the said acidic aqueous solution at a small distance from the surface of the single crystal;

(c) immersing a metal electrode in the said acidic aqueous solution;

(d) electrolyzing the acidic aqueous solution with the wire and the metal electrode as the anode and the cathode, respectively, the current density on the surface of the anode being at least 50 A/dm$^2$, to produce an ozone-containing oxidizing gas which oxidizes the silicon into silicon dioxide;

(e) removing the silicon dioxide by dissolving in the acidic aqueous solution to form a groove in the single crystal; and (f) moving the wire or the single crystal in such a manner that a small distance is kept between the wire and the single crystal at the bottom of the groove until the single crystal is cut through.

2. The method for slicing a single crystal of semiconductor silicon into wafers as claimed in claim 1 in which the wire has a diameter in the range from 0.05 to 0.5 mm.

3. The method for slicing a single crystal of semiconductor silicon into wafers as claimed in claim 1 in which the direction of the wire is perpendicular to the axis of the single crystal.

4. The method for slicing a single crystal of semiconductor silicon into wafers as claimed in claim 1 in which the distance between the wire and the surface of the single crystal does not exceed 1.0 mm.

5. The method for slicing a single crystal of semiconductor silicon into wafers as claimed in claim 1 in which the acidic aqueous solution is kept at a temperature in the range from 25° to 60° C.

6. The method for slicing a single crystal of semiconductor silicon into wafers as claimed in claim 1 in which the acidic aqueous solution contains sulfuric acid and hydrofluoric acid in concentrations in the range from 7 to 35% by weight and in the range from 20 to 60% by weight, respectively.

7. The method for slicing a single crystal of semiconductor silicon into wafers as claimed in claim 1 in which the current density on the surface of the anode is in the range from 50 to 100 A/dm$^2$.

8. The method for slicing a single crystal of semiconductor silicon into wafers as claimed in claim 1 in which the metal wire having a surface of platinum is a platinum-plated copper wire.

* * * * *